(12) United States Patent
Delfyett et al.

(10) Patent No.: US 9,502,856 B2
(45) Date of Patent: Nov. 22, 2016

(54) STABILIZATION OF AN INJECTION LOCKED HARMONICALLY MODE-LOCKED LASER VIA POLARIZATION SPECTROSCOPY FOR FREQUENCY COMB GENERATION

(71) Applicant: UNIVERSITY OF CENTRAL FLORIDA RESEARCH FOUNDATION, INC., Orlando, FL (US)

(72) Inventors: Peter J. Delfyett, Orlando, FL (US); Charles Williams, Orlando, FL (US); Edris Sarailou, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 140 days.

(21) Appl. No.: 14/391,260

(22) PCT Filed: Apr. 11, 2013

(86) PCT No.: PCT/US2013/036068
§ 371 (c)(1),
(2) Date: Oct. 8, 2014

(87) PCT Pub. No.: WO2013/155243
PCT Pub. Date: Oct. 17, 2013

(65) Prior Publication Data
US 2015/0086151 A1    Mar. 26, 2015

Related U.S. Application Data

(60) Provisional application No. 61/622,599, filed on Apr. 11, 2012.

(51) Int. Cl.
*H01S 3/13*    (2006.01)
*H01S 3/109*   (2006.01)
(Continued)

(52) U.S. Cl.
CPC ............ *H01S 5/0092* (2013.01); *G02F 1/225* (2013.01); *G02F 1/353* (2013.01);
(Continued)

(58) Field of Classification Search
CPC .. H01S 5/0092; H01S 5/0085; H01S 5/5036; H01S 5/0064; H01S 5/14; H01S 3/08013; H01S 3/083; H01S 3/10092; H01S 3/1109; H01S 3/1121; H01S 3/1304; H01S 3/1308; H01S 3/08086; G02F 1/255; G02F 1/353; G02F 1/225; G02F 2001/213
USPC .......... 385/3, 14, 16, 24, 122; 372/6, 18, 20, 372/22, 25, 26, 29.011, 29.02, 30, 32, 92, 372/94, 103; 398/152; 356/4.1, 461, 437; 359/326, 238
See application file for complete search history.

(56) References Cited

U.S. PATENT DOCUMENTS 3,596,201 A * 7/1971 Chester ................. H01S 3/1396
144/34.5
3,711,786 A * 1/1973 Vautier ................... H01S 3/086
372/20

(Continued)

OTHER PUBLICATIONS

Notification of Transmittal of International Search Report and Written Opinion for International Application No. PCT/US2013/036068, International Filing Date Apr. 11, 2013.

*Primary Examiner* — Akm Enayet Ullah
(74) *Attorney, Agent, or Firm* — William Greener; Bond, Schoeneck & King, PLLC

(57) ABSTRACT

Stabilization of an injection locked optical frequency comb is achieved through polarization spectroscopy of an active laser cavity, eliminating optical PM sidebands inherent in previous stabilization methods. Optical SNR of 35 dB is achieved. A monolithic AlInGaAs quantum well Fabry-Prot laser injection locked to a passively mode-locked monolithic laser is presented here. The FP laser cavity can be used as a true linear interferometric intensity modulator for pulsed light.

5 Claims, 4 Drawing Sheets

(51) Int. Cl.
*G02B 5/10* (2006.01)
*H05G 2/00* (2006.01)
*H01S 3/137* (2006.01)
*H01S 3/108* (2006.01)
*H01S 5/50* (2006.01)
*G02F 1/225* (2006.01)
*G02F 1/35* (2006.01)
*H01S 5/00* (2006.01)
*H01S 3/10* (2006.01)
*H01S 3/11* (2006.01)
*H01S 5/14* (2006.01)
*H01S 3/08* (2006.01)
*H01S 3/083* (2006.01)
*G02F 1/21* (2006.01)

(52) U.S. Cl.
CPC ...... *H01S 3/08086* (2013.01); *H01S 3/10092* (2013.01); *H01S 3/1109* (2013.01); *H01S 3/1121* (2013.01); *H01S 3/1304* (2013.01); *H01S 3/1308* (2013.01); *H01S 5/0064* (2013.01); *H01S 5/0085* (2013.01); *H01S 5/14* (2013.01); *H01S 5/5036* (2013.01); *G02F 2001/213* (2013.01); *H01S 3/083* (2013.01); *H01S 3/08013* (2013.01)

(56) References Cited

U.S. PATENT DOCUMENTS

| | | | | |
|---|---|---|---|---|
| 4,127,827 A * | 11/1978 | Barry | ............ | H01S 3/109 372/101 |
| 4,314,209 A * | 2/1982 | Wang | ............ | G04F 5/10 331/3 |
| 4,340,870 A * | 7/1982 | Dydyk | ............ | H01P 1/213 331/107 C |
| 4,614,913 A | 9/1986 | Honeycutt et al. | | |
| 5,130,997 A * | 7/1992 | Ortiz | ............ | A61B 18/20 372/103 |
| 5,247,562 A * | 9/1993 | Steinbach | ............ | H05G 2/00 372/22 |
| 5,448,660 A * | 9/1995 | Calvani | ............ | G02F 1/093 385/16 |
| 5,479,082 A * | 12/1995 | Calvani | ............ | G02F 1/093 385/24 |
| 6,005,995 A | 12/1999 | Chen et al. | | |
| 6,084,682 A * | 7/2000 | Zare | ............ | G01N 21/39 356/437 |
| 6,351,252 B1 * | 2/2002 | Atsumi | ............ | G02B 27/0176 345/8 |
| 6,646,723 B1 * | 11/2003 | Dubovitsky | ............ | G01S 7/491 356/4.1 |
| 6,801,324 B1 | 10/2004 | Gray et al. | | |
| 7,697,579 B1 * | 4/2010 | Delfyett | ............ | H01S 3/1109 372/18 |
| 7,835,411 B2 * | 11/2010 | Masuda | ............ | H01S 3/1392 372/20 |
| 7,978,740 B1 | 7/2011 | Delfyett et al. | | |
| 8,995,478 B1 * | 3/2015 | Kobtsev | ............ | H01S 3/06712 372/18 |
| 2002/0071645 A1 * | 6/2002 | Hogan | ............ | H01S 3/108 385/122 |
| 2005/0254535 A1 * | 11/2005 | Loewen | ............ | G02B 5/10 372/32 |
| 2007/0206480 A1 * | 9/2007 | Kuo | ............ | G11B 7/131 369/112.16 |
| 2008/0069159 A1 | 3/2008 | Adel et al. | | |
| 2008/0175597 A1 * | 7/2008 | Arahira | ............ | H04L 7/0075 398/152 |
| 2009/0060497 A1 | 3/2009 | Way | | |
| 2011/0134940 A1 * | 6/2011 | Hartog | ............ | G01D 5/35335 372/6 |
| 2014/0204387 A1 * | 7/2014 | Narayanan | ............ | G01C 19/721 356/461 |
| 2015/0042327 A1 * | 2/2015 | Bulatowicz | ............ | G01R 33/26 324/301 |
| 2015/0263482 A1 * | 9/2015 | Holczer | ............ | H01S 3/137 372/20 |

\* cited by examiner

STABILIZATION OF AN INJECTION LOCKED HARMONICALLY MODE-LOCKED LASER VIA POLARIZATION SPECTROSCOPY FOR FREQUENCY COMB GENERATION

PRIORITY DATA AND INCORPORATION BY REFERENCE

This application is a national stage application pursuant to 35 U.S.C. §371 of International Application No. PCT/US2013/036068, filed Apr. 11, 2013, which claims benefit of priority to U.S. Provisional Application No. 61/622,599 filed Apr. 11, 2012 which is incorporated by reference in its entirety.

BACKGROUND OF THE INVENTION

Field of the Invention

The invention of this application focuses on advances in photonic frequency combs. These find a wide variety of applications, including data harvesting and pattern recognition. An example of a system taking advantage of optical signal processing using stabilized optical frequency combs can be found in U.S. Pat. No. 7,917,039, incorporated-herein-by reference. Related improvements in optical networks are also set forth in U.S. Pat. No. 7,848,655. This invention focuses on improved signal processing systems, employing an improved frequency modulator.

Background of the Invention

The proliferation of applications for photonic frequency combs has fueled the search for sources which can deliver large optical frequency component spacing, narrow optical linewidth, and excellent RF phase noise and stability with small footprints, electrical efficiency, and ease of use. For example, applications such as optical arbitrary waveform generation and coherent communication require access to individual comb components necessitating comb spacing in the multi-gigahertz region [1]. The burgeoning field of multi-heterodyne spectroscopy utilizes a narrow linewidth frequency comb to probe the phase and amplitude information of an unknown signal with different periodicity [2]. This field can also benefit from easily tunable frequency comb spacing by granting control over the detuning frequency between the two signal pulse-trains.

Continuous wave (CW) optical injection locking of semiconductor-based harmonically mode-locked lasers has been shown to produce tunable, gigahertz-spaced frequency comb outputs with high optical and RF signal to noise ratio (SNR), and reduced phase and amplitude noise [3]. By suppressing all but one optical axial mode group via gain competition, an optical frequency comb is generated at the repetition frequency, which is then easily tunable at steps equal to the fundamental cavity frequency, typically tens of MHz. Stand-alone sources are also possible using injection locking in a Coupled Opto-Electronic Oscillator (COEO).

Such injection locking schemes necessitate active stabilization of the laser fiber cavity relative to the injection frequency. Previously, a modified Pound-Drever-Hall (PDH) scheme has been used which requires phase modulation (PM) of the injection signal before injection [3]. An inherent effect of this is that the PM sidebands are injected into the cavity and are then modulated at the repetition rate, producing unwanted carrier sidebands in RF and optical spectra.

As those of skill in the art will recognize, improvements in optical signal processing systems also benefit from improvements of the elements of those systems. Intensity modulators are one of the key components in signal processing, optical communication and photonic analog to digital converters (ADC). Recently, a linear intensity modulator based on an injection locked resonant cavity with gain has been shown and experimental results for a CW input light have been demonstrated. It is well known that an injection locked resonant cavity with gain serves as an arcsine phase modulator [6]. When the arcsine phase modulated light, which is a function of frequency detuning between the cavity and the injection seed, combines with reference arm, it produces an intensity modulated CW light directly proportional to modulating signal [7].

The linearity of the response of this modulator and the possibility of gain at the output are inherent in the above design and no linearization technique is used. This technique has shown 95 dB signal to noise ratio and 120 dB $Hz^{2/3}$ spur-free dynamic range using a VCSEL as the resonant cavity, however, it is limited to using CW light. To adapt this technique for input light signals that are pulsed and periodic, one must use a resonant cavity with multiple resonances within the gain bandwidth.

SUMMARY OF THE INVENTION

In this application, long-term cavity stabilization is performed with a polarization spectroscopy scheme first put forth by Hansch and Couillaud [4], significantly reducing the complexity of the system while eliminating unwanted optical and RF sidebands inherent in the previous modified PDH stabilization. While the Hansch-Couillaud (HC) method has been previously shown in single mode laser systems [5], this is the first time an injection locked, harmonically mode-locked system for the generation and stabilization of a high quality optical frequency comb, important for multi-heterodyne detection, has been advanced.

To provide for enhanced intensity modulation, a shift in design is required. Use of a resonant cavity with multiple resonances within the gain bandwidth suggests the use of a Fabry-Perot laser (FPL) chip as the resonant cavity, where the free spectral range of the FPL chip matches the pulse repetition frequency of the input light to be modulated. This can be realized by injection locking a FPL with the output frequency comb of a mode locked laser (MLL). In this application we disclose injection locking of a monolithic FPL to a monolithic passively MLL by matching both optical spectra and free spectral range of the lasers to realize an arcsine phase modulator. As shown in FIG. 3, below, the FPL can be used in an inferometric setup, where an RF signal is used to modulate the FPL to impart arcsine phase modulation on each injected comb. The resulting interference with the unmodulated signal from the other arm then gives us the ability to generate a true liner intensity modulator for the pulsed light.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION OF THE INVENTION

System Description

A schematic of the laser system is shown in FIG. 1(a). The laser consists of a commercially available semiconductor optical amplifier (SOA) 100 in an external fiber ring cavity. A Mach-Zehnder style intensity modulator (IM) 110 is driven at the desired pulse repetition rate and frequency comb spacing, 10.24 GHz with ~20 dBm of RF power. Two (2) couplers are included for a laser output and injection input, in addition to multiple polarization controllers (PC) 120, 130, 140, 150 and an optical isolator (ISO) 160 to ensure unidirectional operation. A CW narrow linewidth (~1 kHz) laser 170 at 1550 nm is used as the injection seed source while the injected power is controlled using a variable optical attenuator (VOA) 180.

The injection polarization is adjusted for optimal injection locking. The SOA and IM both act as polarization discriminating devices and the injected tone experiences a phase shift while interacting with the cavity. The detection apparatus is placed at the injection coupler reflection port, where the output signal consists of the preferred injection polarization as well as the orthogonal polarization directly reflected from the cavity. A PC is used to rotate both signals such that they interfere in both outputs of a fiberized polarization beam splitter (PBS) 190. A balanced photodetector (BPD) 200 takes the difference between the two signals to produce an error signal.

Figure 1:
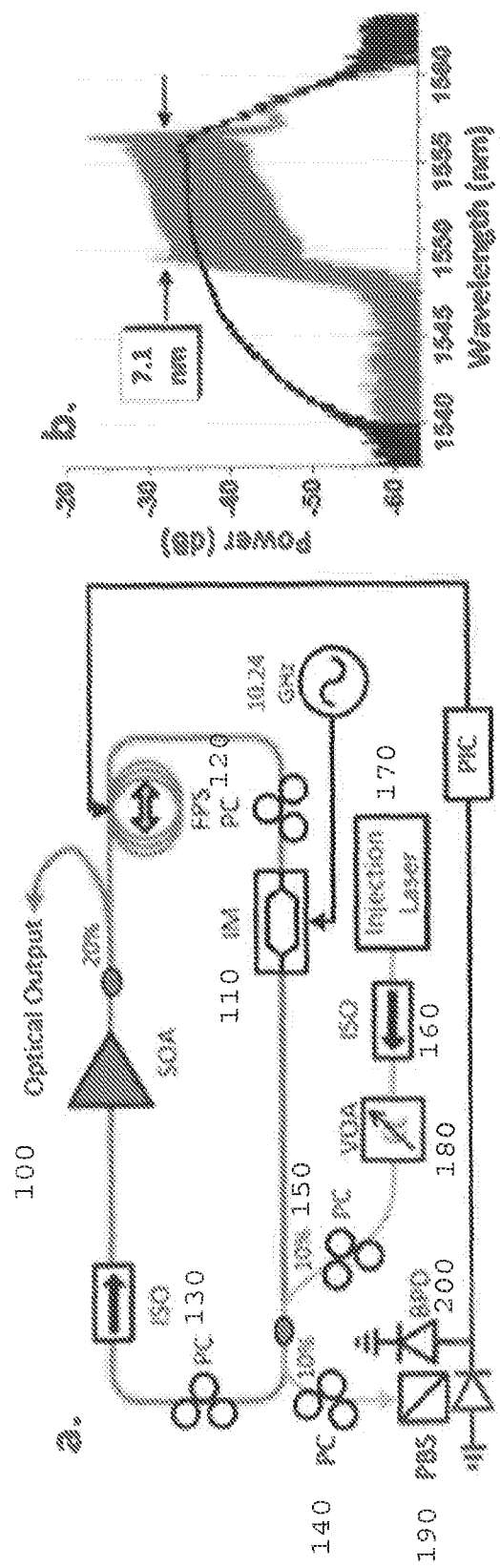
FIG. 1(a) is a schematic of injection locked harmonically mode-locked laser with long-term stabilization via polarization spectroscopy.
FIG. 1(b) is a optical spectra of harmonically mode-locked laser not subject to optical injection (black) and injection locked and stabilized via polarization spectroscopy (blue).
Figure 2:
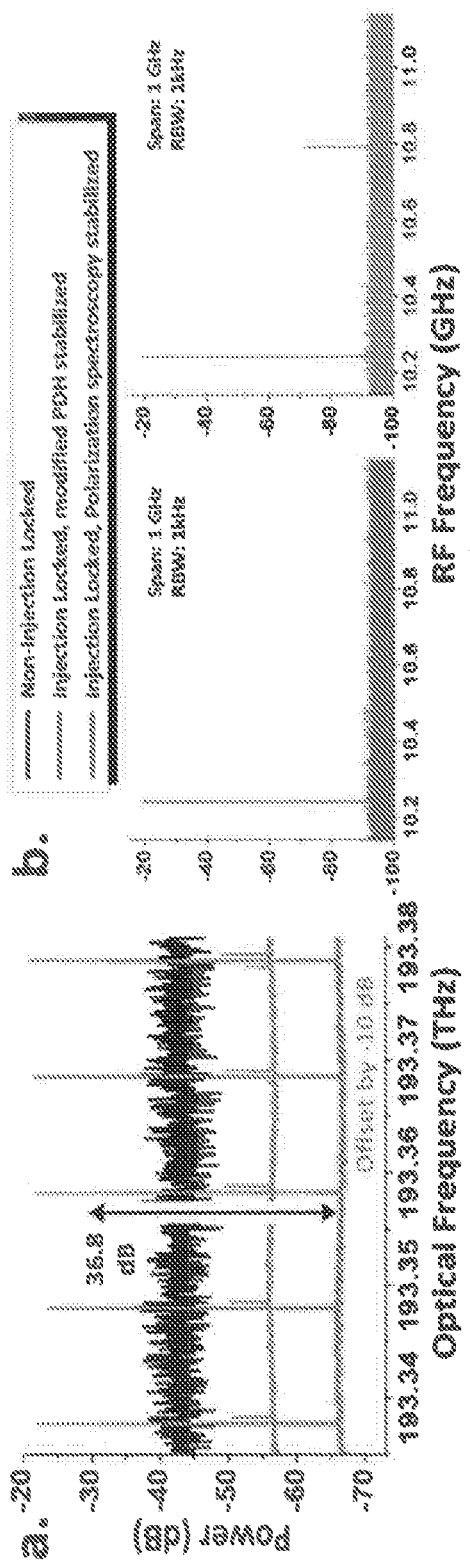
FIG. 2(a) is a high resolution optical spectra of harmonically mode-locked laser output showing frequency comb generation under optical injection with high OSNR. The latter curve was artificially offset by −10 dB to illustrate the absence of PM sidebands on each combline.
FIG. 2(b) is a photodetected RF spectra of the injection locked laser stabilized via the two methods. Note the absence of an RF sideband 550 MHz offset from the 10.24 GHz carrier for the HC stabilization method.

FIG. 1(b) shows the optical spectrum without injection, as well as the full optical bandwidth achieved by the injection locked system, which has been observed to be constant for times greater than twenty (20) minutes. FIG. 2(a) shows the high resolution optical spectra of the harmonically mode-locked laser system centered 50 GHz below the injection frequency. When not injection locked (black), multiple axial mode groups are allowed to lapse, resulting in a seemingly continuous spectrum due to the resolution of the optical spectrum analyzer (<100 MHz). When injection locked, a high quality comb is generated at the repetition frequency. When the cavity is stabilized using the modified PDH scheme (red), sidebands from phase modulation (550 MHz) of the injection seed laser also appear on other combs of the optical spectrum due to modulation by the intracavity IM, visible in FIG. 2(a). Accordingly, RF spurs appear 20 dB above the noise floor at offsets from the carrier frequency in the photodetected RF spectrum, shown in FIG. 2(b). When stabilized using polarization spectroscopy (blue in FIGS. 1 and 2), the high resolution optical spectrum shows a sideband-free optical frequency comb with greater than 35 dB OSNR. Accordingly, the elimination of phase modulation in the detection scheme produces a sideband-free RF spectrum with SNR of 72 dB.

Stabilization via polarization spectroscopy of an injection locked, harmonically mode-locked laser is demonstrated for the generation of 10.24 GHz-spaced optical frequency comb. Injection locking is maintained for greater than twenty (20) minutes with an OSNR of greater than 35 dB and sideband-free photodetected RF SNR of 72 dB. Widely spaced optical frequency combs with easily tunable spacing from this injection locked laser system are ideal for use in the field of multi-heterodyne spectroscopy.

Optional Information

Figure 3:
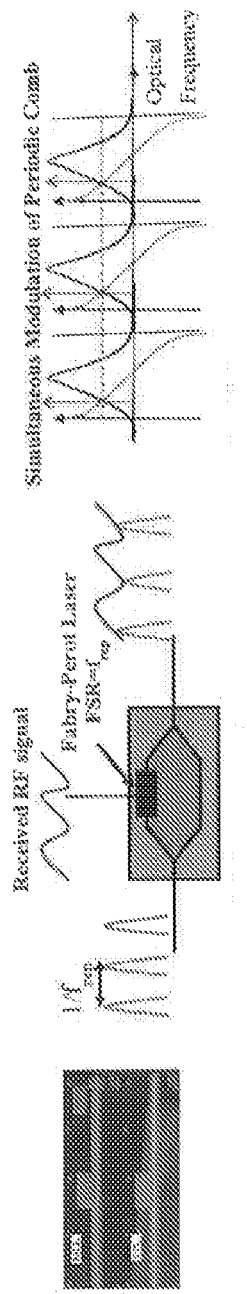
FIG. 3 is a schematic diagram of linear interferometric intensity modulator for pulsed light (center) and the fabricated devices are shown (left). The schematic to the right shows the FP resonances (in black), the corresponding phase response (in red) and the injected comb lines from the MLL (in blue).

A new and promising AlInGaAs-Inp strained quantum well material at 1.55-pm has been used for fabricating FPL and MLLs. This material system is going to replace the conventional InGaAsP—InP material because of a larger conduction band discontinuity ($AE_c$=0.72 $AE_g$) and a smaller valence band discontinuity [8]. The former enables uncooled operation over a large dc bias range and the latter enables a large range of bias voltage, which in fact makes the pulses shorter. The multiple quantum well layers consist of five (5) compressively strained wells (6 nm) and six (6) slightly tensile strained barriers (10 nm). These wells and barriers are followed by a 60 nm graded index separate-confinement hetrostructure (GRINSCH) and a 60 nm AlInGaAs waveguide layer. These active regions are protected by a 20 nm of InGaAsP as a wet etch stop layer. The upper cladding is 1.6 pm of InP followed by a 50 nm of InGaAsp and 200 nm of InGaAs both being heavily doped. The fabricated monolithic integrated FPL and 2-section MLL are shown in FIG. 3. The 2.5 pm wide vertical Mesa waveguides are fabricated by standard lithography and plasma etching techniques followed by two step wet etching terminating at 1.85 pm to form a single mode waveguide. The electrical isolation between the saturable absorber (SA) and gain section is achieved by removing the first two heavily doped contact layers. BCB polymer has been used for planarization. Because of slightly different group refractive indices of the two devices which is due to different injection currents, they have to be cleaved with appropriate lengths to match the mode spacing. The FPL has a total length of 1950 μm and the 2-section MLL was cleaved with the total length of 1912 μm with a SA of 56 μm (3% of the total length) separated by 10 μm gap from the gain section.

The threshold currents of the FP and 2-section FP laser were 53 mA and 55 mA respectively, with slope efficiencies of 0.12 and 0.11 W/A, respectively. Passive mode-locking was achieved by forward biasing the gain section and reverse biasing the SA. With an optimized 3% SA, stable mode-locking was observed for a wide range of bias currents (from threshold to as large as three (3) times the threshold) and reverse bias voltages of −0.5V to −3.8V. The optical spectrum is centered at 1555 nm with a mode spacing of 22.15 GHz and 10 dB bandwidth of 14.1 nm.

Figure 4:
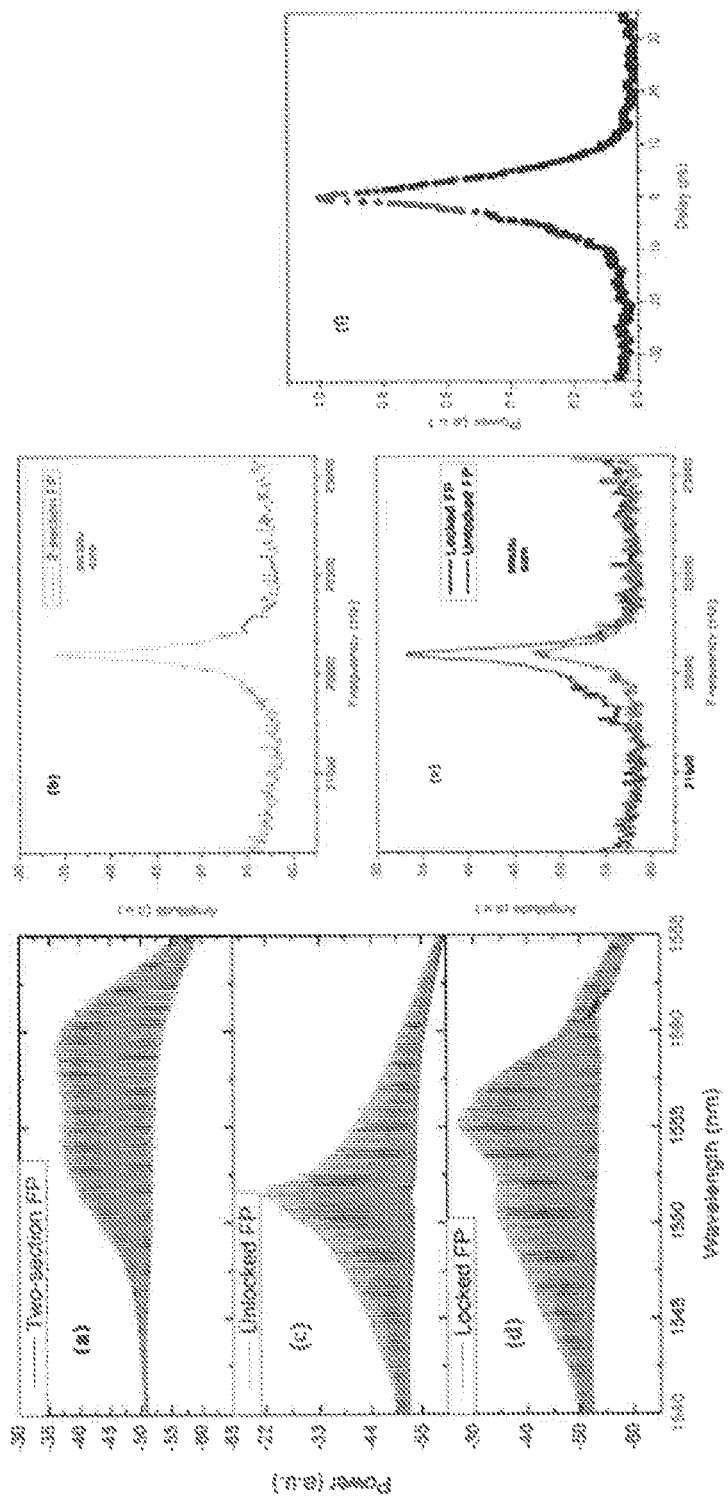
FIG. 4(a)(b) is an optical and RF spectra of the 2-section passively mode-locked FP laser (c), (d) is optical spectra of the FPL before and after injection locking (e) RF spectra of the FPL before and after injection locking (f) auto correlation trace of the FP injection locked laser.

FIGS. 4(a) and (b) show the optical and the RF spectra of the MLL with the bias current of 147 mA and reverse bias of −2.8 at 20° C. FIGS. 2(c) and (d) show the optical spectra of the FPL at 23° C. with the bias current of 56 mA before and after injection locking respectively. These parameters were carefully tuned to match the RF tones. FIG. 4(e) shows the RF spectra of the FPL before and after injection locking with 0.1 mW injection power.

Frequency pulling of the RF beat tone of the FPL to the RF tone of the MLL is observed and the RF tone of 2 MHz linewidth has been measured which matches the 2-section FPL, as expected. Furthermore the optical spectrum of the FPL after injection locking is much wider, by 11 nm (10 dB width). FIG. 4(f) shows the autocorrelation trace from the FP injection locked laser. The pulses are 4.6 ps if a Guassian pulse shape is assumed. These results clearly demonstrate that the each axial modes of the FPL is coherent and locked to the injected comb from the passively MLL. By modulating the current of the injection locked FPL, one imparts arcsine phase modulation on each injected comb component. By interfering this modulated signal with its unmodulated counterpart, the desired true linear intensity modulator for pulsed light is generated.

An injection locked AlInGaAs quantum well FPL as a resonant cavity is demonstrated. The FP monolithic device is locked to a monolithic passively MLL with the same free spectral range. This injection locked FPL can be used as the resonant cavity with gain in a linear interferometric intensity modulator for pulsed light.

REFERENCES

[1] P. J. Delfyett, I. Ozdur, N. Hoghooghi, M. Akbulut, J. Davila-Rodriguez, and S. Bhooplapur, "Advanced Ultrafast Technologies Based on Optical Frequency Combs," Selected Topics in Quantum Electronics, IEEE Journal of, vol. PP, pp. 1-17, 2011.
[2] I. Coddington, W. C. Swann, and N. R. Newbury, "Coherent linear optical sampling at 15 bits of resolution," Opt. Lett., vol. 34, pp. 2153-2155, 2009.
[3] C. Williams, F. Quinlan, and P. J. Delfyett, "Injection-Locked Mode-Locked Laser With Long-Term Stabilization and High Power-per-Combline," IEEE Photonics Technology Letters, vol. 21, pp. 94-96, January-February 2009.
[4] T. W. Hansch and B. Couillaud, "Laser frequency stabilization by polarization spectroscopy of a reflecting reference cavity," Optics Communications, vol. 35, pp. 441-444, 1980.
[5] P. Esherick and A. Owyoung, "Polarization feedback stabilization of an injection-seeded Nd:YAG laser for spectroscopic applications," J. Opt. Soc. Am. B, vol. 4, pp. 41-47, 1987.
[6] R. Adler, "A Study of Locking Phenomena in Oscillators", Proceedings of the IEEE, vol. 61, pp. 1380-1385 (1973).
[7] N. Hoghooghi, I. Ozdur, M. Akbulut, J. Davila-Rodriguez, and P. J. Delfyett, "Resonant Cavity Linear Interferometeric Intensity Modulator", Opt. Lett. vol. 35, pp. 1218-1220 (2010).
[8] J. R. Karin, R. J. Helkey, D. J. Derickson, R. Nagarajan, D. S. Allin, J. E. Bowers, and R. L. Thornton, "Ultrafast dynamics in field-enhanced saturable absorbers," Appl. Phys. Lett., vol. 64, pp. 676-678, 1994.

While the present invention has been disclosed both generically, and with reference to specific alternatives, those alternatives are not intended to be limiting unless reflected in the claims set forth below. The invention is limited only by the provisions of the claims, and their equivalents, as would be recognized by one of skill in the art to which this application is directed.

What is claimed is:

1. An apparatus for producing a stable optical frequency comb having an adjustable comb tooth separation, comprising:
   a harmonically mode-locked laser (MLL) further including:
      a polarization discriminating semiconductor optical amplifier (SOA);
      a polarization discriminating resonant optical fiber cavity;
      an intracavity polarization discriminating mode locking component; and
      an RF oscillator operationally coupled to the mode locking component;
   an injection laser source optically coupled to the resonant optical fiber cavity; and
   a resonant cavity stabilizing component including:
      a polarization beam splitter optically coupled to the resonant optical fiber cavity;
      a balanced photodetector optically coupled to the polarization beam splitter;
      a proportional integral controller coupled to the balanced photodetector; and
      a resonant optical fiber cavity length adjuster.

2. The optical frequency comb source apparatus of claim 1, wherein the intracavity polarization discriminating mode locking component is an intensity modulator.

3. The optical frequency comb source apparatus of claim 1, wherein the injection laser source is a continuous wave laser.

4. The optical frequency comb source apparatus of claim 1, wherein the resonant cavity stabilizing component comprises a Hansch-Couillaud stabilizer architecture.

5. The optical frequency comb source apparatus of claim 1, wherein the resonant optical fiber cavity length adjuster is a fiber phase shifter (FPS).

* * * * *